United States Patent
Yan et al.

(10) Patent No.: US 10,026,914 B2
(45) Date of Patent: Jul. 17, 2018

(54) ORGANIC LIGHT EMITTING DEVICE AND METHOD FOR FABRICATING THE SAME, AND DISPLAY APPARATUS

(71) Applicant: BOE TECHNOLOGY GROUP CO., LTD., Beijing (CN)

(72) Inventors: Guang Yan, Beijing (CN); Chin-Lung Liao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/512,099

(22) PCT Filed: Feb. 19, 2016

(86) PCT No.: PCT/CN2016/074134
§ 371 (c)(1),
(2) Date: Mar. 17, 2017

(87) PCT Pub. No.: WO2016/150264
PCT Pub. Date: Sep. 29, 2016

(65) Prior Publication Data
US 2017/0279062 A1    Sep. 28, 2017
US 2018/0138438 A9    May 17, 2018

(30) Foreign Application Priority Data
Mar. 24, 2015    (CN) .......................... 2015 1 0130819

(51) Int. Cl.
*H01L 29/08*    (2006.01)
*H01L 51/50*    (2006.01)
(Continued)

(52) U.S. Cl.
CPC ...... *H01L 51/5024* (2013.01); *H01L 51/0003* (2013.01); *H01L 51/0008* (2013.01); *H01L 51/0013* (2013.01); *H01L 51/56* (2013.01)

(58) Field of Classification Search
CPC ............. H01L 51/5024; H01L 51/0003; H01L 51/0008; H01L 51/0013; H01L 51/56
See application file for complete search history.

(56) References Cited

U.S. PATENT DOCUMENTS 7,948,163 B2    5/2011    Parthasarathy et al.
2014/0291627 A1*   10/2014    Kim ................... H01L 51/0013
                                                                   257/40
(Continued)

FOREIGN PATENT DOCUMENTS

CN          1815774 A     8/2006
CN          1845357 A    10/2006
(Continued)

OTHER PUBLICATIONS

Xiaolong Yang et al., "Thiazole-based metallophosphors of iridium with balanced carrier injection/transporting features and their two-colour WOLEDs fabricated by both vacuum deposition and solution processing-vacuum deposition hybrid strategy", Journals of Materials Chemistry | 2012 | 22| pp. 7136-7148 (13 total).
(Continued)

*Primary Examiner* — Victor A Mandala
*Assistant Examiner* — Colleen E Snow
(74) *Attorney, Agent, or Firm* — Armstrong Teasdale LLP

(57) ABSTRACT

The embodiments of the present disclosure provide an organic light emitting device including a first electrode, a second electrode, and an organic functional layer, wherein the organic functional layer includes a first doped layer fabricated in a first process, a second doped layer fabricated in a second process, and an auxiliary layer formed between the first doped layer and the second doped layer, wherein the auxiliary layer is used to improve the performance of the first doped layer. The embodiments of the present disclosure further provide a method for fabricating the organic light emitting device. The embodiments of the present disclosure (Continued)

also provide a display apparatus including the organic light emitting device.

17 Claims, 3 Drawing Sheets

(51) Int. Cl.
*H01L 51/00* (2006.01)
*H01L 51/56* (2006.01)

(56) References Cited

U.S. PATENT DOCUMENTS

2015/0069366 A1* 3/2015 Lunt .................. H01L 51/5016
257/40
2016/0218154 A1* 7/2016 Pyo .................... H01L 27/3211

FOREIGN PATENT DOCUMENTS

| CN | 1897295 A | 1/2007 |
|---|---|---|
| CN | 101510589 A | 8/2009 |
| CN | 102027614 A | 4/2011 |
| CN | 102130306 A | 7/2011 |
| CN | 102800812 A | 11/2012 |
| CN | 103579522 A | 2/2014 |
| CN | 103682116 A | 3/2014 |
| CN | 104022229 A | 9/2014 |
| CN | 104078485 A | 10/2014 |
| CN | 104218049 A | 12/2014 |
| CN | 104701458 A | 6/2015 |

OTHER PUBLICATIONS

China First Office Action, Application No. 2015101308194, dated Jun. 2, 2016, 17 pps.: with English Translation.
China Second Office Action, Application No. 2015101308194, dated Nov. 7, 2016, 14 pps.: with English Translation.
China Rejection, Application No. 2015101308194, dated Mar. 3, 2017, 14 pps.: with English Translation.
PCT Written Opinion, Application No. PCT/CN2016/074134, dated May 18, 2016, 10 pps.: with English Translation.
English Translation of PCT International Search Report, Application No. PCT/CN2016/074134, dated May 18, 2016, 2 pps.

* cited by examiner

ORGANIC LIGHT EMITTING DEVICE AND METHOD FOR FABRICATING THE SAME, AND DISPLAY APPARATUS

CROSS REFERENCE TO RELATED APPLICATIONS

This application is a National Stage Entry of PCT/CN2016/074134 filed Feb. 19, 2016, which claims the benefit and priority of Chinese Patent Application No. 201510130819.4, filed on Mar. 24, 2015, the disclosures of which are incorporated by reference herein in their entirety as part of the present application.

BACKGROUND

The embodiments of the present disclosure relate to the field of semiconductor fabricating technologies, and particularly, to an organic light emitting device and a method for fabricating the same, and a display apparatus.

The current solution process can fabricate green and red light devices with excellent performances, but there is still a large gap between such fabricated blue light device and the VTE-fabricated blue light device in efficiency or in lifetime. Thus, when the solution process is used to fabricate the full color Organic Light-Emitting Diode (OLED) display, an Open Mask is usually adopted to fabricate the blue light common layer. This functional layer serves as an electron transfer layer in the red and green subpixels without emitting light, while acts as a blue light emitting layer in the blue subpixels.

Usually both sides of an interface between the blue light emitting layer and the solution process light emitting layer are doped layers, and the process modes of the first and second doped layers are different from each other, which will easily cause the problems such as efficiency decrease. In the current OLED having a blue light common layer, such an interface is not efficiently improved, and thus the performance of the OLED is certainly affected.

BRIEF DESCRIPTION

The embodiments of the present disclosure provide an organic light emitting device and a method for fabricating the same, and a display apparatus, which are capable of improving the problem of a defective heterogeneous interface, thereby extending the lifespan of the OLED, reducing the operating voltage and improving the efficiency.

A first aspect of the embodiments of the present disclosure provides an organic light emitting device including a first electrode, a second electrode, and an organic functional layer, wherein the organic functional layer includes a first doped layer fabricated in a first process, a second doped layer fabricated in a second process, and an auxiliary layer formed between the first doped layer and the second doped layer.

In one example, the material of the auxiliary layer is the same as the body material of the second doped layer, and the auxiliary layer is used to improve the performance of the first doped layer.

In one example, the auxiliary layer has an electron mobility more than $1\times10^{-4}$ $m^2/V*s$ (square meters per volt seconds).

In one example, the auxiliary layer has a thickness ranging from 1 nm to 5 nm.

In one example, the auxiliary layer is fabricated in the second process.

In one example, the first doped layer includes an organic light emitting layer, and the second doped layer includes a blue light common layer.

In one example, the first process is selected from one or any combination of a spin-coating method, a knife coating method, an electrospray coating method, a slit coating method, a strip coating method, a dip coating method, a drum coating method, an ink-jet printing method, a nozzle printing method, and a letterpress printing method.

In one example, the second process is selected from one or any combination of a vacuum thermal evaporation, an organic vapor deposition, a laser-induced thermal imaging, and a radiation-induced sublimation transfer printing.

In one example, the organic functional layer further includes a hole injection layer, a hole transport layer, an electron transport layer, and an electron injection layer.

A second aspect of the embodiments of the present disclosure provides a method for fabricating an organic light emitting device including sequentially forming a first electrode, an organic functional layer and a second electrode on a substrate, wherein, forming the organic functional layer includes fabricating a first doped layer in a first process, forming an auxiliary layer on the first doped layer, and fabricating a second doped layer on the auxiliary layer in a second process.

In one example, the material of the auxiliary layer is the same as the body material of the second doped layer, and the auxiliary layer is used to improve the performance of the first doped layer.

In one example, the auxiliary layer has an electron mobility more than $1\times10^{-4}$ $m^2/V*s$.

In one example, the auxiliary layer has a thickness ranging from 1 nm to 5 nm.

In one example, forming the auxiliary layer includes fabricating the auxiliary layer in the second process.

In one example, the first doped layer includes an organic light emitting layer, and the second doped layer includes a blue light common layer.

In one example, the first process is selected from one or any combination of a spin-coating method, a knife coating method, an electrospray coating method, a slit coating method, a strip coating method, a dip coating method, a drum coating method, an ink-jet printing method, a nozzle printing method, and a letterpress printing method.

In one example, the second process is selected from one or any combination of a vacuum thermal evaporation, an organic vapor deposition, a laser-induced thermal imaging, and a radiation-induced sublimation transfer printing.

In one example, forming the organic functional layer further includes forming a hole injection layer on the first electrode, forming a hole transport layer on the hole injection layer, forming an electron transport layer on the second doped layer, and forming an electron injection layer on the electron transport layer.

A third aspect of the embodiments of the present disclosure provides a display apparatus including any one of the aforementioned organic light emitting devices.

As can be seen from the above technical solutions, the embodiments of the present disclosure provide an organic light emitting device and a method for fabricating the same, and a display apparatus. By forming an auxiliary layer between the first doped layer and the second doped layer, the performance of the first doped layer can be improved, and the problem of the defective heterogeneous interface can be solved, thereby extending the lifespan of the OLED, reducing the operating voltage and improving the efficiency.

BRIEF DESCRIPTION OF THE DRAWINGS

In order to more clearly describe the technical solutions in the embodiments of the present disclosure, the drawings to be used in the descriptions of the embodiments will be briefly introduced as follows. Obviously, the following drawings just illustrate some embodiments of the present disclosure, and a person skilled in the art can obtain other drawings from them without paying any creative effort.

DETAILED DESCRIPTION

The technical solutions in the embodiments of the present disclosure will now be clearly and completely described as follows in conjunction with the accompanying drawings of the embodiments of the present disclosure. It will be apparent that those described embodiments are just a part of the embodiments of the present disclosure and are not intended to be exhaustive. Based on the embodiments of the present disclosure, any other embodiment obtained by a person skilled in the art without paying any creative effort shall fall within the protection scope of the present disclosure.

Figure 2:
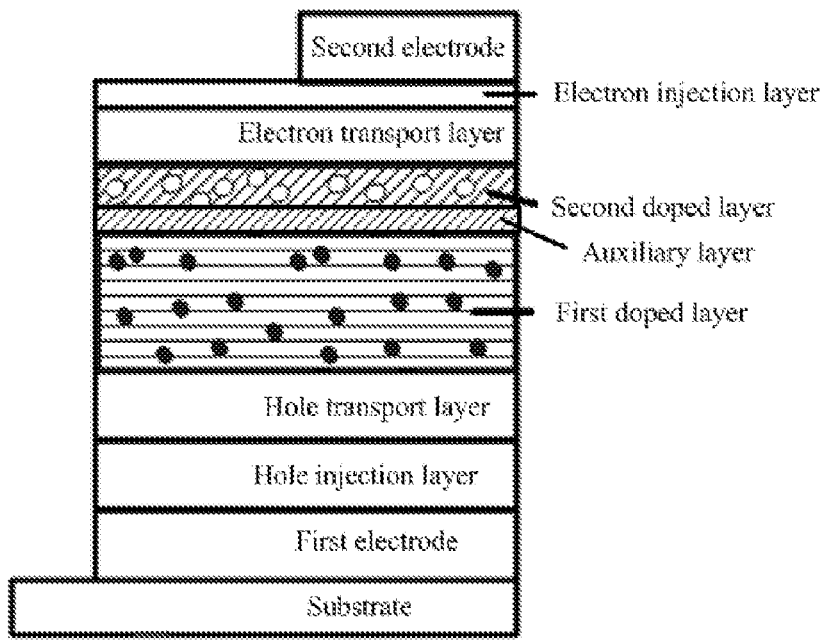
FIG. 2 shows a structure diagram of an organic light emitting device provided by an embodiment of the present disclosure.

As illustrated in FIG. 2, an embodiment of the present disclosure provides an organic light emitting device including a first electrode, a second electrode, and an organic functional layer. The organic functional layer may include a first doped layer fabricated in a first process, a second doped layer fabricated in a second process, and an auxiliary layer formed between the first doped layer and the second doped layer.

In one embodiment, the material of the auxiliary layer may be the same as the body material of the second doped layer, and the auxiliary layer is used to improve the performance of the first doped layer.

In one embodiment, the electron mobility of the auxiliary layer is more than $1\times10^{-4}$ m$^2$/V*s, and the thickness of the auxiliary layer is ranging from 1 nm to 5 nm.

In one embodiment, the auxiliary layer may be fabricated in the second process, i.e., the auxiliary layer and the second doped layer may be fabricated in the same process.

In one embodiment, the first doped layer is an organic light emitting layer. The second doped layer is a blue light common layer. In the organic light emitting device provided according to the embodiment of the present disclosure, the auxiliary layer is provided between the first doped layer and the second doped layer, and the material of the auxiliary layer is the same as the body material of the blue light common layer (i.e., the second doped layer), which is helpful to improve the performance of the organic light emitting layer, thereby improving the performance of the light emitting device.

In one embodiment, the first process for fabricating the first doped layer may be selected from one or any combination of a spin-coating method, a knife coating method, an electrospray coating method, a slit coating method, a strip coating method, a dip coating method, a drum coating method, an ink-jet printing method, a nozzle printing method, and a letterpress printing method.

In one embodiment, the second process for fabricating the second doped layer and the auxiliary layer may be selected from one or any combination of a vacuum thermal evaporation, an organic vapor deposition, a laser-induced thermal imaging, and a radiation-induced sublimation transfer printing.

As illustrated in FIG. 2, in an embodiment of the present disclosure, the organic functional layer may further include a hole injection layer, a hole transport layer, an electron transport layer, and an electron injection layer.

Another embodiment of the present disclosure provides a method for fabricating the aforementioned organic light emitting device including sequentially forming a first electrode, an organic functional layer and a second electrode on a substrate, wherein forming the organic functional layer may include fabricating a first doped layer in a first process, forming an auxiliary layer on the first doped layer, and fabricating a second doped layer on the auxiliary layer in a second process.

In one embodiment, the material of the auxiliary layer may be the same as the body material of the second doped layer, and the auxiliary layer may be used to improve the performance of the first doped layer.

In one embodiment, the electron mobility of the auxiliary layer is more than $1\times10^{-4}$ m$^2$/V*s, and the thickness of the auxiliary layer is ranging from 1 nm to 5 nm.

In one embodiment, the auxiliary layer may be fabricated in the second process, i.e., the auxiliary layer and the second doped layer may be fabricated in the same process.

In one embodiment, the first doped layer may be an organic light emitting layer, and the second doped layer may be a blue light common layer.

In one embodiment, the first process may be selected from one or any combination of a spin-coating method, a knife coating method, an electrospray coating method, a slit coating method, a strip coating method, a dip coating method, a drum coating method, an ink-jet printing method, a nozzle printing method, and a letterpress printing method.

In one embodiment, the second process may be selected from one or any combination of a vacuum thermal evaporation, an organic vapor deposition, a laser-induced thermal imaging, and a radiation-induced sublimation transfer printing.

Specifically, forming the organic functional layer may further include the steps of: forming a hole injection layer on the first electrode, forming a hole transport layer on the hole injection layer, forming an electron transport layer on the second doped layer, and forming an electron injection layer on the electron transport layer.

Another embodiment of the present disclosure provides a display apparatus including an organic light emitting device in the aforementioned embodiments. The display apparatus for example may be an apparatus having a display function, such as a display panel, a monitor, a tablet computer, a mobile phone, a navigator, a photo camera, a video camera, or a television.

Figure 3:
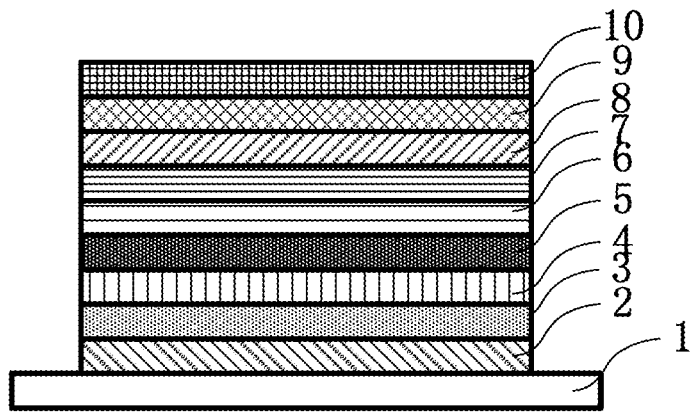
FIG. 3 shows a cross-sectional diagram of a structure of an organic light emitting device provided by an embodiment of the present disclosure.
Figure 4:
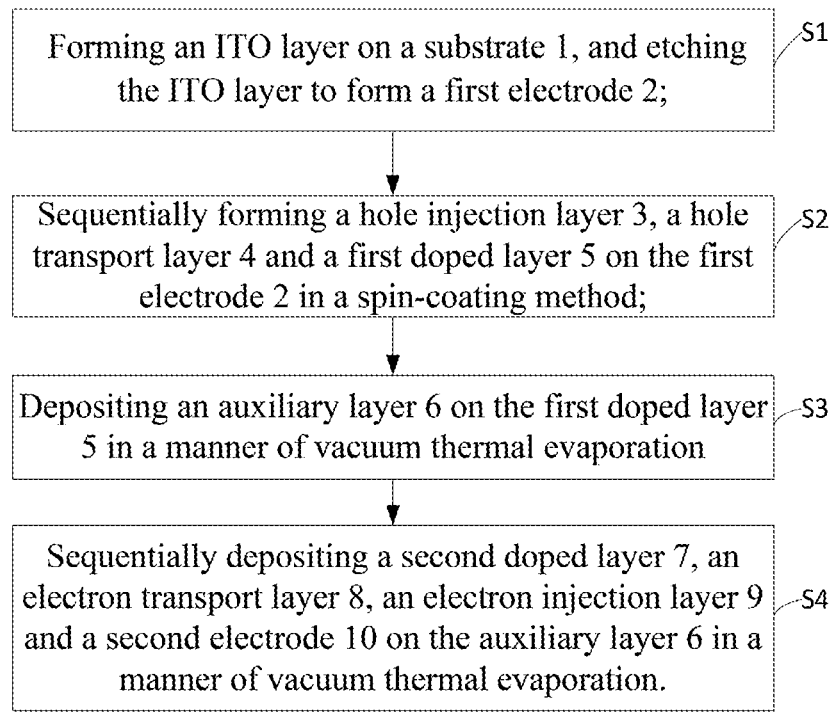
FIG. 4 shows a flow diagram of a method for fabricating an organic light emitting device provided by an embodiment of the present disclosure.

In order to more clearly describe the technical solution of the present disclosure, a specific embodiment of the present disclosure is described as follows in conjunction with the cross-sectional diagram of a structure of an organic light emitting device as illustrated in FIG. 3. As illustrated in FIG. 4, a method for fabricating the organic light emitting device provided by the specific embodiment specifically may include the steps as follows.

S1: forming an Indium Tin Oxide (ITO) layer on a substrate 1, and etching the ITO layer to form a first electrode 2.

In this embodiment, the substrate 1 may be a transparent substrate made of glass. The thickness of the first electrode 2 is about 70 nm. To be noted, after the formation of the first electrode 2, the ITO glass substrate may be cleaned in an ultrasonic environment of deionized water, acetone and anhydrous ethanol, then dried with nitrogen N2, and treated with oxygen plasmas.

S2: sequentially forming a hole injection layer 3, a hole transport layer 4 and a first doped layer 5 on the first electrode 2 in a spin-coating method.

Specifically, Poly (3,4-ethylenedioxythiophene): poly (styrenesulfonate) (PEDOT:PSS) is spin-coated on the first electrode 2 at first to form the hole injection layer 3, wherein the thickness of the hole injection layer 3 is about 20 nm, next, Polyvinylcarbazole (PVK) is spin-coated on the hole injection layer 3 to form the hole transport layer 4, wherein the thickness of the hole transport layer 4 is about 20 nm, further, a spin-coating is performed on the hole transport layer to form the first doped layer 5, wherein the dopant main body of the first doped layer 5 may be polyfluorene, the dopant object of the first doped layer 5 may be Tris (2-phenylpyridine) iridium (III) (Ir(ppy)$_3$), and the thickness of the first doped layer 5 is about 60 nm.

S3: depositing an auxiliary layer 6 on the first doped layer 5 in a manner of vacuum thermal evaporation.

Specifically, the above processed substrate may be placed in an evaporation chamber, after the vacuum degree is below $5\times10^{-4}$ Pa, 2-methyl-9,10-bis (naphthalen-2-yl) anthracene (MADN) is deposited in a manner of vacuum thermal evaporation to form the auxiliary layer 6, wherein the thickness of the auxiliary layer 6 is about 2 nm.

S4: Sequentially depositing a second doped layer 7, an electron transport layer 8, an electron injection layer 9, and a second electrode 10 on the auxiliary layer 6 in a manner of vacuum thermal evaporation.

Specifically, the second doped layer 7 may be deposited on the auxiliary layer 6 in a manner of vacuum thermal evaporation, wherein the second doped layer 7 is a blue light common layer, the dopant main body of which is MAND, and the dopant object is a blue fluorescent material 1-4-di-[4-(N,N-diphenyl)amino]styryl-benzene (DSA-Ph). The concentration of the dopant object is about 5%, and the thickness of the second doped layer 7 is about 18 nm, next, 4,7-Diphenyl-1,10-phenanthroline (Bphen) is deposited on the second doped layer 7 to form the electron transport layer 8, wherein the thickness of the electron transport layer 8 is about 20 nm, lithium fluoride (LiF) is deposited on the electron transport layer 8 to form the electron injection layer 9, wherein the thickness of the electron injection layer 9 is about 1 nm, aluminum (Al) is deposited on the electron injection layer to form the second electrode 10, wherein the thickness of the second electrode 10 is about 120 nm.

In the above vacuum thermal evaporation process, except that Al was etched using a metal mask and the evaporation rate was 0.3 nm/s, the remaining layers were etched using an open mask and the evaporation rate was 0.1 nm/s. In this embodiment, the light-emitting area of the device is 2 mm×2 mm.

In order to reflect the technical effects of the embodiments of the present disclosure, an existing organic light emitting device will be described below.

Figure 1:
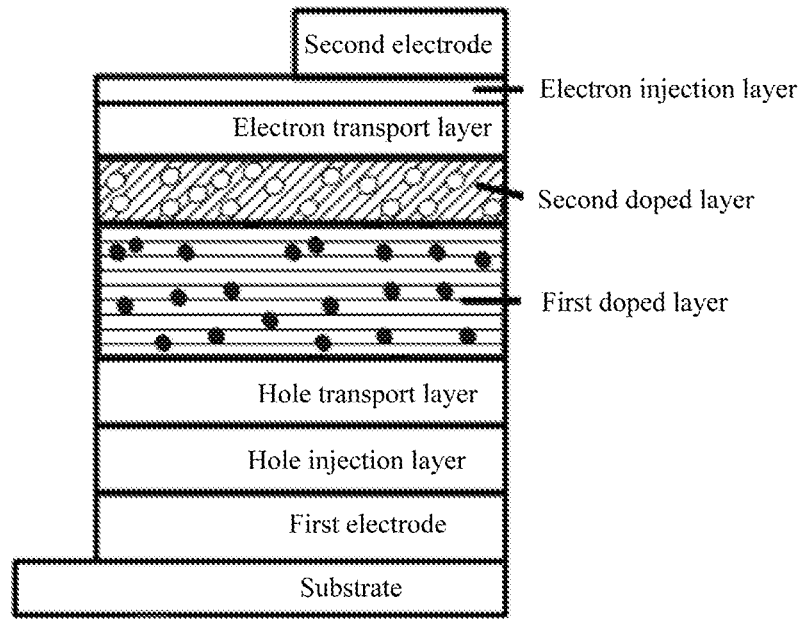
FIG. 1 shows a structure diagram of an organic light emitting device having a blue light common layer.

Referring to FIG. 1, the organic light emitting device includes a transparent ITO anode glass substrate, a hole injection layer, a hole transport layer, a first doped layer/an organic light emitting layer, a second doped layer/a blue light common layer, an electron transport layer, an electron injection layer, and a second electrode/a cathode, which are orderly laminated.

In the organic light emitting device as illustrated in FIG. 1, the ITO glass substrate may be transparent glass having an ITO film, the first electrode may be an ITO with a layer thickness of about 70 nm, the hole injection layer may be Poly (3,4-ethylenedioxythiophene): poly (styrenesulfonate) (PEDOT: PSS); the hole transport layer may be Polyvinylcarbazole (PVK), the dopant main body of the first doped layer/green light emitting layer may be polyfluorene, and the dopant object thereof may be Tris (2-phenylpyridine) iridium (III) (Ir(ppy)$_3$), the dopant main body of the second doped layer/blue light common layer may be 2-methyl-9,10-bis (naphthalen-2-yl) anthracene (MAND), and the dopant object thereof may be 1-4-di-[4-(N,N-diphenyl)amino] styryl-benzene (DSA-Ph), the electron transport layer may be 4,7-Diphenyl-1,10-phenanthroline (Bphen); the electron injection layer may be LiF, and the second electrode/cathode may be Al.

Similarly, the device as illustrated in FIG. 1 may be fabricated in the following steps: the transparent glass substrate having an ITO (surface resistance thereof <30Ω/☐) is photo-etched to form an ITO pattern electrode, next the ITO glass substrate is sequentially cleaned in an ultrasonic environment of deionized water, acetone and anhydrous ethanol, then dried with nitrogen N2, and treated with oxygen plasmas; an hole injection layer PEDOT: PSS (20 nm), a hole transport layer PVK (20 nm) and a first doped layer polyfluorene: Ir (ppy)$_3$ (60 nm) are sequentially spin-coated on the ITO, finally, the processed substrate is placed in an evaporation chamber, after the vacuum degree is below $5\times10^{-4}$ Pa, a second doped layer/blue light common layer MAND: DSA-Ph (5%) (20 nm), an electron transport layer Bphen (20 nm), an electron injection layer LiF (1 nm), and a second electrode/cathode Al (120 nm) are sequentially deposited in a manner of vacuum thermal evaporation. In the above vacuum thermal evaporation process, except that Al was etched using a metal mask and the evaporation rate was 0.3 nm/s, the remaining layers were etched using an open mask and the evaporation rate was 0.1 nm/s, and the light-emitting area of the device was 2 mm×2 mm.

By testing the organic light emitting device provided by the above specific embodiments of the present disclosure and the existing organic light emitting device as illustrated in FIG. 1, a comparison result can be obtained, as shown in Table 1:

TABLE 1 the comparison of Technical effects

| | | 1000 nits | | | | |
|---|---|---|---|---|---|---|
| | V | C.E. (cd/A) | P.E. (lm/w) | CIEx | CIEy | E.Q.E (%) |
| Embodiment 1 | 5.63 | 37.1 | 20.7 | 0.278 | 0.641 | 10.05 |
| Comparative embodiment | 5.81 | 35.5 | 19.2 | 0.278 | 0.641 | 9.66 |

As can be seen from Table 1, under the condition that the brightness is 1000 nits, the organic light emitting device according to the embodiment of the present disclosure has an operating voltage of 5.63 V, a current efficiency of 37.1 cd/A, a power efficiency of 20.7 lm/w, a chromaticity coordinate (CIE1931) of (0.278, 0.641), and an external quantum efficiency of 10.05%, while the organic light emitting device as illustrated in FIG. 1 has an operating voltage of 5.81 V, a current efficiency of 35.5 cd/A, a power efficiency of 19.2 m/w, a chromaticity coordinate (CIE1931) of (0.278, 0.641), and an external quantum efficiency of 9.66%. It is clear that under the same brightness condition, the operating voltage of the organic light emitting device according to the embodiment of the present disclosure is lower than that of the organic light emitting device illustrated in FIG. 1, while the current efficiency, the power efficiency and the external quantum efficiency of the organic light emitting device according to the embodiment of the present disclosure are higher than those of the organic light emitting device illustrated in FIG. 1. Therefore, the technical solution provided by the embodiment of the present disclosure can effectively reduce the operating voltage and improve the efficiency.

Figure 5:
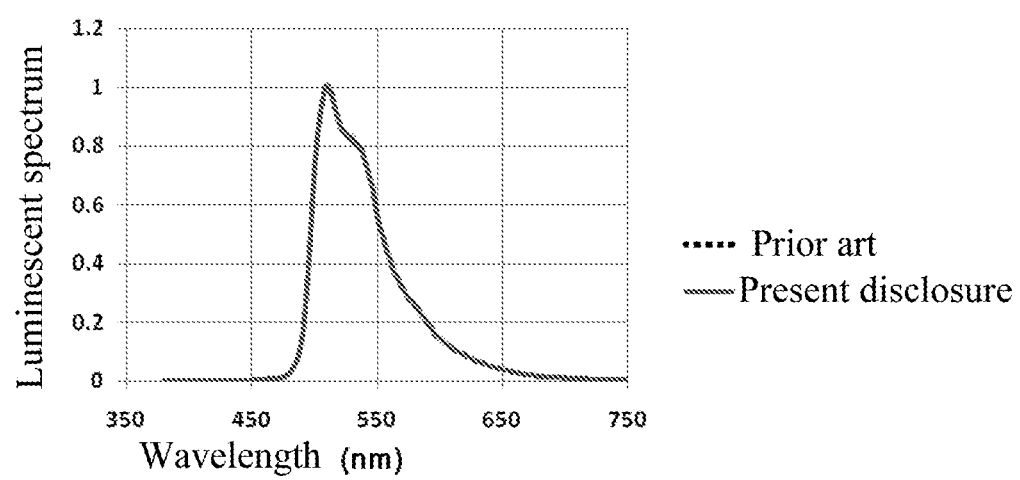
FIG. 5 shows a spectrum comparison diagram for an organic light emitting device provided by an embodiment of the present disclosure and an organic light emitting device in the prior art.

FIG. 5 shows a spectrogram comparison result for an organic light emitting device provided by an embodiment of the present disclosure and an organic light emitting device in the prior art. As can be seen from FIG. 5, the spectrogram of the organic light emitting device provided by the embodiment of the present disclosure substantially coincides with that of the organic light emitting device in the prior art. Thus the technical solution provided by the embodiment of the present disclosure does not change the light color.

The embodiments of the present disclosure provide an organic light emitting device and a method for fabricating the same. By adding an auxiliary layer made of a material the same as the body material of the second doped layer between the first doped layer and the second doped layer, the performance of the first doped layer can be improved, and the problem of the defective heterogeneous interface can be solved, thereby extending the lifespan of the OLED, reducing the operating voltage and improving the efficiency.

To be noted, in the drawings the sizes of the layers and areas might be exaggerated in order for clarity of illustration. In addition, it will be appreciated that when an element or layer is referred to as being "on" another element or layer, it may be directly located on other element, or there may be an intermediate layer; when an element or layer is referred to as being "under" another element or layer, it may be directly located under other element, or there may be more than one intermediate layer or element; and when an element or layer is referred to as being "between" two layers or elements, it may be an unique layer between the two layers or elements, or there may be more than one intermediate layer or element. Similar reference signs indicate similar elements throughout the Specification.

In the embodiments of the present disclosure, the terms "first", "second", and "third" are only used for the purpose of description, and cannot be construed as indicating or implying relative importance.

The above embodiments are merely illustrative of the technical solutions of the present disclosure and not intended to be limiting thereof. Although the present disclosure has been described in details with reference to the aforementioned embodiments, a person skilled in the art shall appreciate that the technical solutions described in the aforementioned embodiments still can be amended, or some technical features therein may be equivalently replaced, and such modifications or substitutions do not cause the essence of corresponding technical solution to deviate from the spirit and range of the technical solution of any embodiment of the present disclosure.

What is claimed is:

1. A organic light emitting device comprising:
a first electrode;
a second electrode; and
an organic functional layer, wherein the organic functional layer comprises a first doped layer fabricated in a first process, a second doped layer fabricated in a second process, and an auxiliary layer formed between the first doped layer and the second doped layer, wherein a material of the auxiliary layer is the same as a body material of the second doped layer, and wherein the auxiliary layer is used to improve the performance of the first doped layer.

2. The organic light emitting device according to claim 1, wherein the auxiliary layer has an electron mobility more than $1 \times 10^{-4}$ m$^2$/V*s (square meters per volt seconds).

3. The organic light emitting device according to claim 1, wherein the auxiliary layer has a thickness ranging from 1 nm to 5 nm.

4. The organic light emitting device according to claim 1, wherein the auxiliary layer is fabricated in the second process.

5. The organic light emitting device according to claim 1, wherein the first doped layer comprises an organic light emitting layer, and wherein the second doped layer comprises a blue light common layer.

6. The organic light emitting device according to claim 1, wherein the first process is at least one of a spin-coating method, a knife coating method, an electrospray coating method, a slit coating method, a strip coating method, a dip coating method, a drum coating method, an ink-jet printing method, a nozzle printing method, and a letterpress printing method.

7. The organic light emitting device according to claim 1, wherein the second process is at least one of a vacuum thermal evaporation, an organic vapor deposition, a laser-induced thermal imaging, and a radiation-induced sublimation transfer printing.

8. The organic light emitting device according to claim 1, wherein the organic functional layer further comprises a hole injection layer, a hole transport layer, an electron transport layer, and an electron injection layer.

9. A method for fabricating an organic light emitting device comprising sequentially forming a first electrode, an organic functional layer, and a second electrode on a substrate, wherein forming the organic functional layer comprises:
fabricating a first doped layer in a first process;
forming an auxiliary layer on the first doped layer; and
fabricating a second doped layer on the auxiliary layer in a second process, wherein a material of the auxiliary layer is the same as a body material of the second doped layer, and wherein the auxiliary layer is used to improve the performance of the first doped layer.

10. The method according to claim 9, wherein forming the auxiliary layer comprises fabricating the auxiliary layer in the second process.

11. The method according to claim 9, wherein the first doped layer includes an organic light emitting layer, and wherein the second doped layer includes a blue light common layer.

12. The method according to claim 9, wherein the first process is at least one of a spin-coating method, a knife coating method, an electrospray coating method, a slit coating method, a strip coating method, a dip coating method, a drum coating method, an ink-jet printing method, a nozzle printing method, and a letterpress printing method.

13. The method according to claim 9, wherein the second process is at least one of a vacuum thermal evaporation, an organic vapor deposition, a laser-induced thermal imaging, and a radiation-induced sublimation transfer printing.

14. The method according to claim 9, wherein forming the organic functional layer further comprises:
    forming a hole injection layer on the first electrode;
    forming a hole transport layer on the hole injection layer;
    forming an electron transport layer on the second doped layer; and
    forming an electron injection layer on the electron transport layer.

15. A display apparatus comprising an organic light emitting device which comprises:
    a first electrode;
    a second electrode; and
    an organic functional layer, wherein the organic functional layer comprises a first doped layer fabricated in a first process, a second doped layer fabricated in a second process, and an auxiliary layer formed between the first doped layer and the second doped layer, wherein a material of the auxiliary layer is the same as a body material of the second doped layer, and wherein the auxiliary layer is used to improve the performance of the first doped layer.

16. The display apparatus according to claim 15, wherein the auxiliary layer has an electron mobility more than $1 \times 10^{-4}$ m$^2$/V*s (square meters per volt seconds).

17. The display apparatus according to claim 15, wherein the auxiliary layer has a thickness ranging from 1 nm to 5 nm.

* * * * *